(12) United States Patent
Gulati et al.

(10) Patent No.: US 11,418,132 B2
(45) Date of Patent: Aug. 16, 2022

(54) CAPACITIVE ENERGY HARVESTER FROM AC POWER LINES

(71) Applicants: Manoj Gulati, New Delhi (IN); Shwetak N. Patel, Seattle, WA (US)

(72) Inventors: Manoj Gulati, New Delhi (IN); Shwetak N. Patel, Seattle, WA (US)

(*) Notice: Subject to any disclaimer, the term of this patent is extended or adjusted under 35 U.S.C. 154(b) by 67 days.

(21) Appl. No.: 16/675,028

(22) Filed: Nov. 5, 2019

(65) Prior Publication Data

US 2020/0144938 A1   May 7, 2020

(51) Int. Cl.
*H02N 1/08* (2006.01)
*G01R 19/145* (2006.01)

(52) U.S. Cl.
CPC ............. *H02N 1/08* (2013.01); *G01R 19/145* (2013.01)

(58) Field of Classification Search
None
See application file for complete search history.

(56) References Cited

U.S. PATENT DOCUMENTS

| 10,192,678 B2* | 1/2019 | Koo ..................... G01R 31/62 |
| 2016/0061862 A1* | 3/2016 | Nulty ................... G01R 15/142 |
| | | 324/127 |

* cited by examiner

*Primary Examiner* — Daniel C Puentes
(74) *Attorney, Agent, or Firm* — Rumit R. Kanakia

(57) ABSTRACT

The various embodiments herein provide an energy harvester which can capacitively harvest stray electric field from low-voltage AC power lines without a physical grounding connection. The energy harvester comprises an inner electrode, an outer electrode and a circuit. The inner electrode forms an inner periphery of an upper portion of a harvester housing. The outer electrode forms an inner base of a lower portion of the harvester housing to provide a local ground reference. The circuit is housed within the lower portion of the harvester housing to direct stored energy and control an energy discharge.

15 Claims, 14 Drawing Sheets

CAPACITIVE ENERGY HARVESTER FROM AC POWER LINES

BACKGROUND

Technical Field of Invention

The embodiments herein generally relate to a power harvesting and particularly relates to a capacitive energy harvester from AC power lines. The present invention more particularly relates to an energy harvester with non-ohmic contact leading to a harvesting of energy without significant loss.

DESCRIPTION OF RELATED ART

Energy harvesting (also known as power harvesting or energy scavenging or ambient power) is the process by which energy is derived from external sources (e.g., solar power, thermal energy, wind energy, salinity gradients, and kinetic energy, also known as ambient energy), captured, and stored for small, wireless autonomous devices, like those used in wearable electronics and wireless sensor networks.

Internet of Things (IoT) applications and platforms are becoming increasingly prevalent. Alongside this growth of smart devices comes the added costs for deployment, maintenance and the need to manage power consumption so as to reduce recurrent maintenance costs of replacing batteries. To alleviate the recurrent battery replacement and maintenance, and disclosed herein is a battery-free, stick-on capacitive energy harvester that harvests the stray electric field generated around AC power lines (110 V/230 V) without an ohmic connection to earth ground reference, thereby obviating the need for cumbersome scraping of paint on concrete walls or digging a earth ground plate. Furthermore, the harvester does not require any appliance or load to be operating on the power line and can continuously harvest power after deployment. In effect, end users are expected simply stick-on the harvester onto any existing power-line cord to power a sensing platform. Controlled lab measurements and real-world deployments demonstrate that the device can harvest 270.6 µJ of energy from a 14 cm long interface in 12 min. Several embodiments outlining practical applications for the technology disclosed herein are also included as examples, such as distributed temperature monitoring, appliance state monitoring, and environmental parameter logging for indoor farming.

Various prior art systems have been proposed to harvest energy using stray electric field from power lines, but these solutions have traditionally required a direct ohmic connection to ground i.e. the harvester requires an end-user to run a wire from each of the harvester devices to earth ground which is achieved in prior art by connecting to a copper plate inside a wall. However, for large infrastructure establishing the prior art harvesters becomes time consuming and costlier process as it requires to chip the wall panel for connection of the ground contact.

Hence, there is a need for an energy harvester with a non-ohmic contact to ease a connection in a running AC line in a housing infrastructure.

The above-mentioned shortcomings, disadvantages and problems are addressed herein, as detailed below.

SUMMARY OF THE INVENTION

The primary object of the embodiments herein is to provide an energy harvester with a non-ohmic contact to ease a connection in a running AC line in a housing infrastructure.

Another object of the embodiments herein is to provide a capacitive energy harvester with a plug and play assembly to mount the harvester at any user selected place in an infrastructure.

The various embodiments herein provide an energy harvester from low-voltage AC power lines without a physical grounding connection. The energy harvester comprises an inner electrode, an outer electrode and a circuit. The inner electrode forms an inner periphery of an upper portion of a harvester housing. The outer electrode forms an inner base of a lower portion of the harvester housing to provide a local ground reference. The circuit is housed within the lower portion of the harvester housing to direct stored energy and control an energy discharge.

According to one embodiment herein, the circuit for a sensing application further comprises a diode rectifier bridge, a storage capacitor, a high side switch, the diode rectifier bridge, a wireless master control unit (MCU) and an antenna. The diode rectifier bridge is connected to the inner and outer electrodes. A first conducting plate of the storage capacitor is connected with the positive output of the rectifying circuit and a second conducting plate of the storage capacitor is connected with the negative output of the rectifying circuit. The high side switch is connected to the storage capacitor. The wireless MCU is connected to the high side switch. The antenna is also connected to the wireless MCU.

According to one embodiment of the present invention, the energy harvester implements a computer readable program for wireless sensing. The computer readable program comprises at least one of a time-based wireless sensing application, an event-based wireless sensing application, a continuous wireless sensing application and a sparse wireless sensing application.

According to one embodiment of the present invention, the energy harvester further comprises an inductive pick-up for sensing an on/off state of an appliance.

According to one embodiment of the present invention, the energy harvester harvests an energy up to 270 µJ in at least 12 minutes using the energy harvester with a length of at least 14 cm deployed at least 10 cm above ground.

According to one embodiment of the present invention, a harvested energy is scalable by changing a dimension of the energy harvester and a placement above the ground.

According to one embodiment of the present invention, the inner electrode clamps a bare as well as an insulated wire bundle.

According to one embodiment of the present invention, the high side switch has an on-state current of 70 nA and off-state quiescent current of 100 pA and works without a MOSFET based switch as well.

According to one embodiment of the present invention, the high-side switch turns 'ON' an output as the storage capacitor hits a value of Vth+500 mV and allows a discharging of the storage capacitor to Vth. The Vth is a pre-programmed threshold voltage of the high side switch.

These and other aspects of the embodiments herein will be better appreciated and understood when considered in conjunction with the following description and the accompanied drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The other objects, features and advantages will occur to those skilled in the art from the following description of the preferred embodiment and the accompanied drawings in which.

DETAILED DESCRIPTION OF THE DRAWINGS

In the following detailed description, a reference is made to the accompanied drawings that form a part hereof, and in which the specific embodiments that may be practiced is shown by way of illustration. The embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

Figure 1:
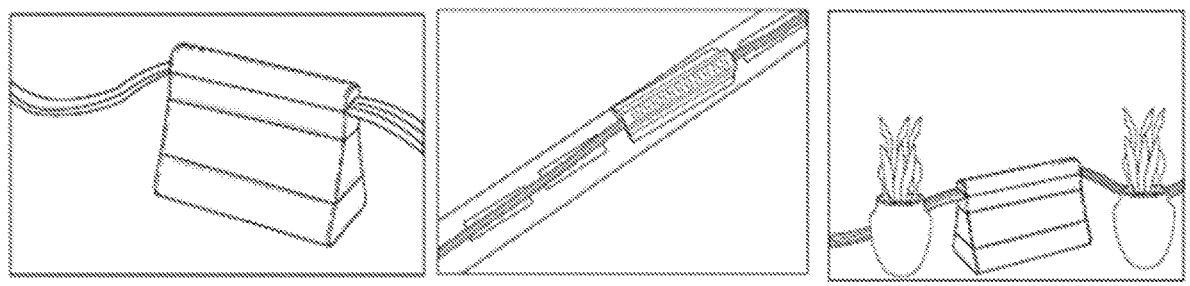
FIG. 1 illustrates an exemplary diagram depicting three real-world applications being powered by the capacitive energy harvester, according to an embodiment of the present invention.

FIG. 1 illustrates an exemplary diagram depicting three real-world applications being powered by the capacitive energy harvester, according to an embodiment of the present invention. With respect to FIG. 1, the energy harvester is plug and play device and is placeable at any place in line with an AC input wire.

Figure 2A:
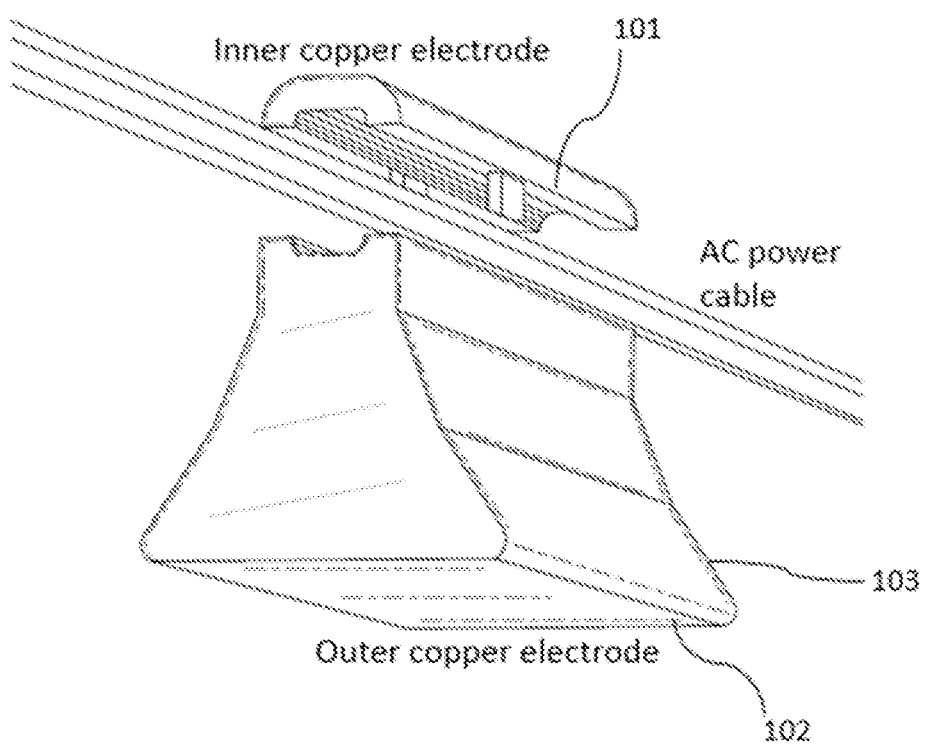
FIG. 2a shows capacitive energy harvester clamping on to a low-voltage power cable and harvesting power.
Figure 2B:
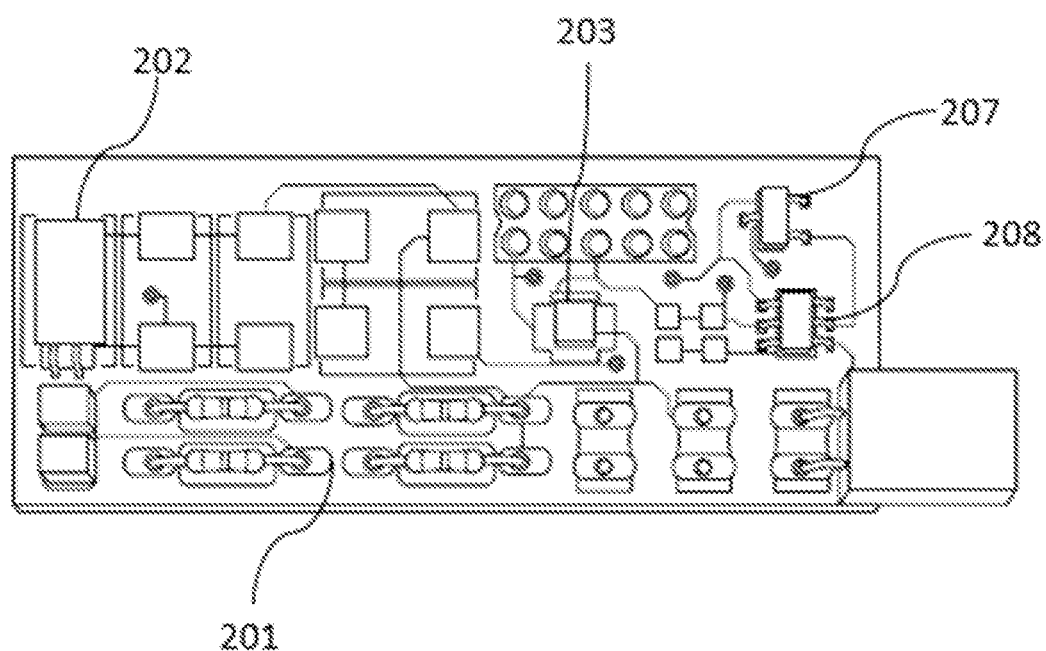
FIG. 2b shows power harvesting circuitry, according to one embodiment herein.
Figure 4:
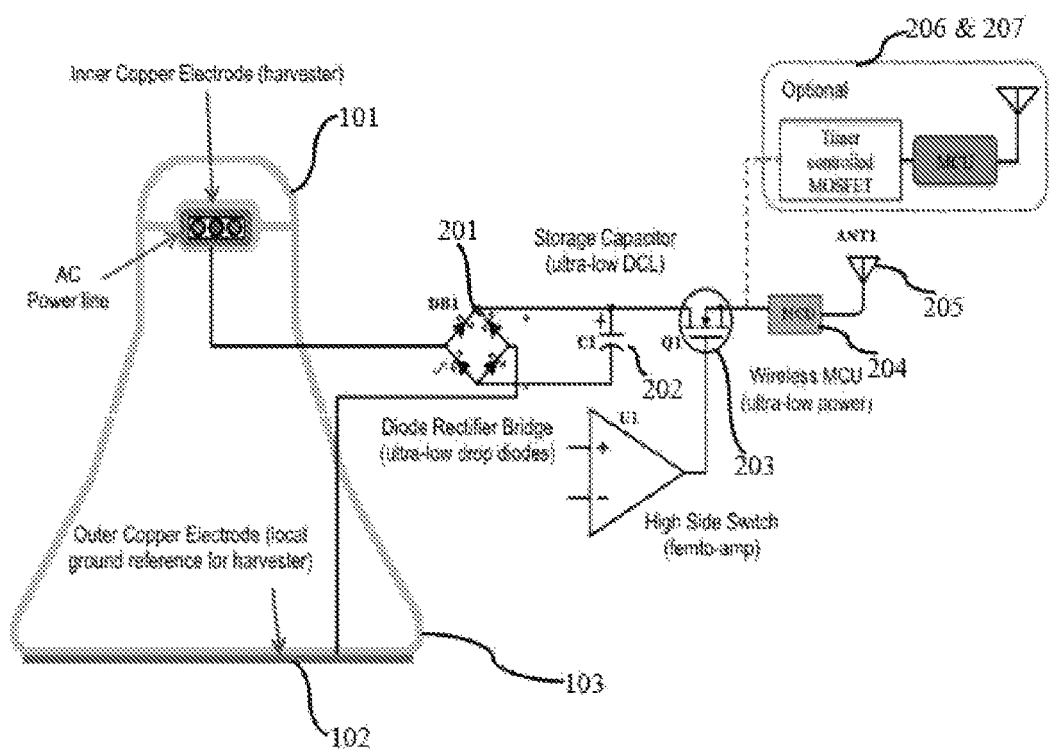
FIG. 4 illustrates a block diagram of the capacitive energy harvester for wireless microcontroller (MCU) applications, according to an embodiment of the present invention.

FIG. 2a shows capacitive energy harvester clamping on to a low-voltage power cable and harvesting power, and FIG. 2b shows power harvesting circuitry, according to one embodiment of the present invention. With respect to FIGS. 2a, 2b and 4, the energy harvester comprises an inner electrode (101), an outer electrode (102) and a circuit. The inner electrode (101) forms an inner periphery of an upper portion of a harvester housing (103). The outer electrode (102) forms an inner base of a lower portion of the harvester housing (103) to provide a local ground reference. The circuit is housed within the lower portion of the harvester housing (103) to direct stored energy and control an energy discharge.

According to one embodiment herein, the circuit for a sensing application further comprises a diode rectifier bridge (201), a storage capacitor (202), a high side switch (203), a wireless master control unit (MCU) (204) and an antenna (205). The diode rectifier bridge (201) is connected to the inner electrode (101). A first conducting plate of the storage capacitor (202) is connected with the positive output of the rectifying circuit (201) and a second conducting plate of the storage capacitor (202) is connected with the negative output of the rectifying circuit (201). The high side switch (203) is connected to the storage capacitor (202). The wireless MCU (204) is connected to the high side switch (203). The antenna (205) is also connected to the wireless MCU (204). The diode rectifier bridge (201) rectifies the capacitive-coupled '60' Hz power line signal and stores energy in the storage capacitor (202) with low leakage current. A high side switch (203), timer (207), and MOSFET (206) controls the attached peripherals i.e. the antenna (205) and the wireless MCU (204). The timer controlled MOSFET circuit is further implemented to drive wireless MCU for continuous and event-based sensing applications. In order to remove the requirement of a reference earth ground, a double-layer stacked capacitor model is provided for the harvesting electrodes.

In order to generate a local reference ground that serves a lower potential than the inner electrode (101), a secondary layer of conductive electrodes is made of copper tape, which is propped up by a support structure. Further, the capacitance by the secondary electrodes between the inner and the outer electrodes (Cs) is as low as possible. In an embodiment, air with a dielectric constant of ~1, is the primary dielectric between the inner and the outer electrodes. The area and separation of the capacitive electrodes are design parameters, since they directly determine the voltage and power available at the output of the inner, the outer and the secondary electrodes.

According to one embodiment of the present invention, the AC voltage output from the capacitive electrodes (the inner, the outer and the secondary electrodes) is fed to a diode rectifier bridge consisting of small signal Schottky diodes for AC-DC conversion. The small signal Schottky diodes have a forward voltage drop ($V_f$) of around 100 mV ($I_f$=1 µA) at 60 Hz.

After AC-DC conversion, the output of the rectifier bridge is fed to the storage capacitor. The choice of capacitor depends highly on its DC leakage (DCL) and equivalent series resistance (ESR). The dielectric material of a capacitor is an imperfect insulator that allows a small amount of current to flow between the two conductive plates which is called the DCL.

Further, the storage capacitor has as little DCL and ESR as possible in order to harvest effectively from a nano-watt source. The maximum DCL for the storage capacitor is 18.8 μA. Since, the energy harvester is operating at much lower temperature and voltage to reduce the DCL significantly and the storage capacitor has low ESR (around 0.9Ω).

According to one embodiment of the present invention, a cold-start consumes a few milli-amperes of current to turn on the primary boost converter or charge pump or a quiescent current (Iq) of ~1 μA, making, the boost converter impractical for the energy harvester. The charge controllers generally perform a cold-start from a secondary storage cell or battery, but a battery-free harvester is used. In order to control the output load in a hysteric manner, N-MOSFET-based high-side switches are used. The high-side switches drain quiescent current on the order of microamperes to facilitate the bias voltage requirements for the gate-source voltage (Vgs). To overcome the high drain quiescent current, the nano-watt high-side load switch is used. The high side switch has an on-state current of 70 nA, an off-state quiescent current of 100 pA, a factory-programmed threshold voltage ($V_{th}$) for a comparator and does not require any external bias voltage like conventional N-MOSFET-based switches. The high-side switch turns the output ON when the storage capacitor hits Vth+500 mV and lets the storage capacitor discharge down to $V_{th}$, giving it a hysteric window of 500 mV. The storage capacitor is always harvesting charge, even when the high-side switch is closed but depending on the size of electrodes, the storage capacitor takes variable amounts of time to charge up to $V_{th}$ again.

During the on-state, the high-side switch powers up an ultra low-power (ULP) wireless MCU for approximately 20 ms. All the sensing and data communication tasks are handled by the wireless MCU. The wireless master control unit (MCU) over other MCUs supports long-range sub-GHz band (fc=868 MHz) communication with an integrated ULP MCU (Active Tx consumes ~11 mA at 1.95 V) and also supports a 15.4-Stack for sub-GHz band communication.

Further, a continuous sensing application to periodically turn ON an ULP MCU using the nano-power timer and the P-MOSFET, sample the ADC, and write the ADC values to the MCU's FRAM is provided. The timer and MOSFET are connected to the output of the high-side switch and the gate of the MOSFET is controlled with the timer. After a known interval of 12-24 hours, the data that has been stored in the FRAM is transmitted using a low-power transmitter.

Figure 3:
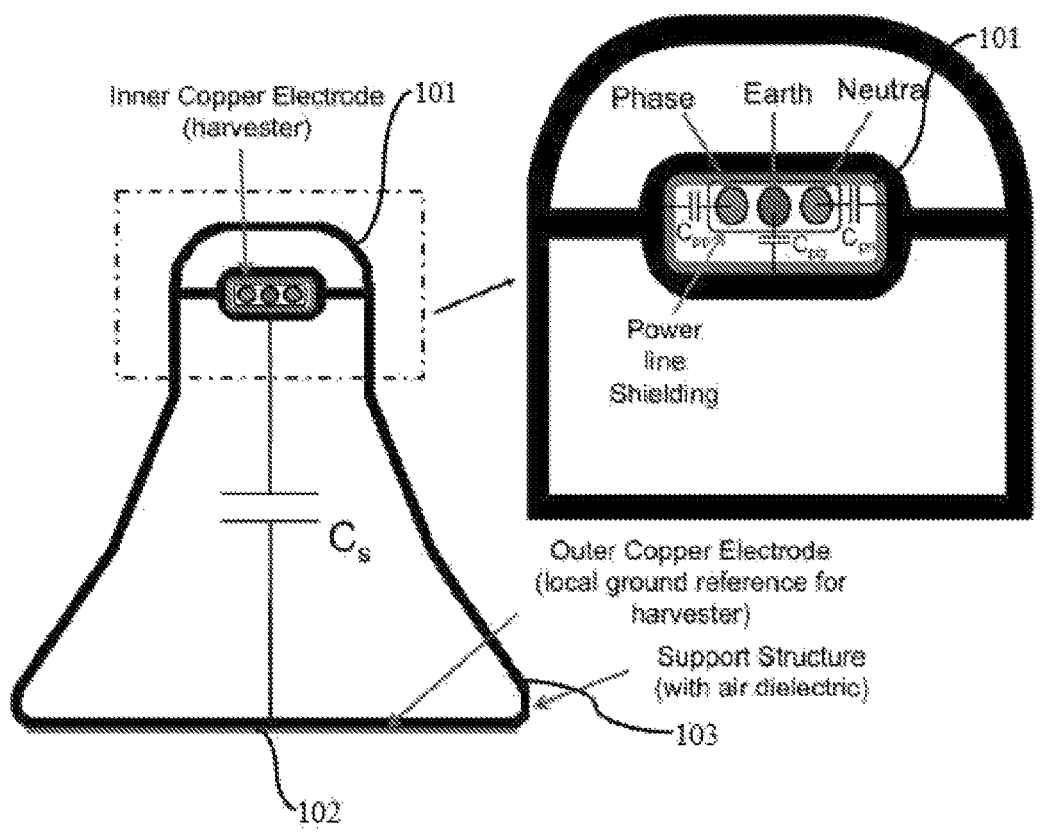
FIG. 3 illustrates an exemplary diagram of a cross-sectional model of an AC power line having three conductors (phase, neutral, and earth), according to an embodiment of the present invention.

FIG. 3 illustrates an exemplary diagram of a cross-sectional model of an AC power line having three conductors (phase, neutral, and earth), according to an embodiment of the present invention. With respect to FIG. 3, each conductor has a primary capacitance (Cpp, Cpn and Cpg) with respect to the inner electrode and a secondary capacitance (Cs) exists between the inner and outer electrodes of harvester. Cpp represents the primary capacitive coupling between the outer surface of the power line and the phase conductor carrying a 110 V AC signal. Cpp serves as the driving source for an alternating electric field on the surface. The other two conductors present in a multi-wire topology, neutral and ground, are tied to earth ground at the distribution side of the transformer. The capacitances corresponding to these two conductors, denoted as Cpn and Cpg, do not contribute any electric field.

Figure 5:
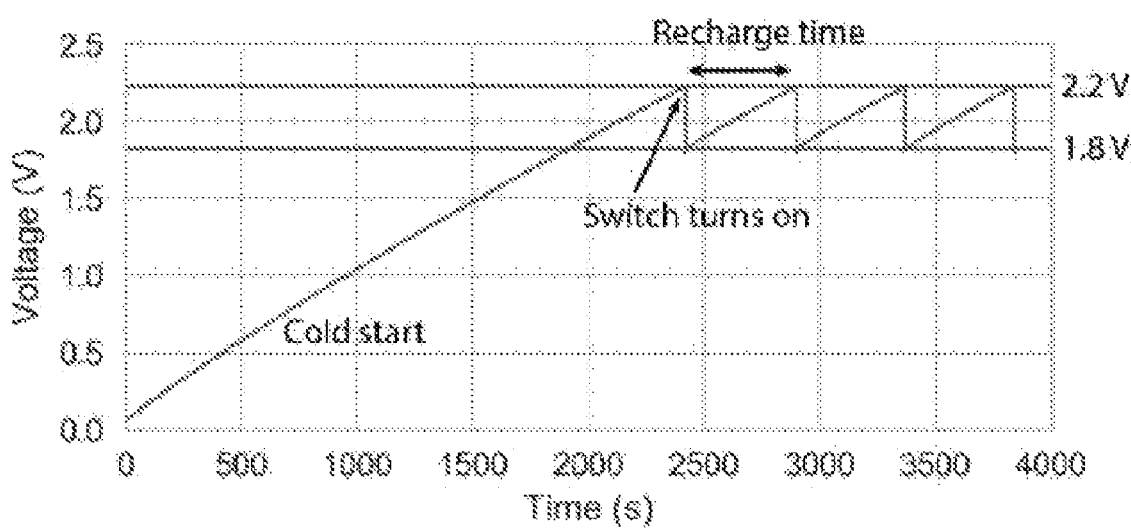
FIG. 5 illustrates a graphical representation of a working of the energy harvester in terms of voltage vs time depiction, according to an embodiment of the present invention.

FIG. 5 illustrates a graphical representation of a working of the energy harvester in terms of voltage vs time depiction, according to an embodiment of the present invention. With respect to FIG. 5, When first installed, the harvester begins its cold start period. Once the storage capacitor reaches the trigger voltage of the high-side switch (2.21 V), the switch high side activates the energy harvester until the voltage drops to the lower cut-off voltage (1.8 V). After reaching the lower cut-off voltage, the recharge time of the energy harvester is significantly reduced.

The energy harvester provides high performance during a good coupling to the earth's ground. The construction materials with a higher value of the dielectric constant serves as a better coupling medium for the energy harvester in comparison.

Figure 6:
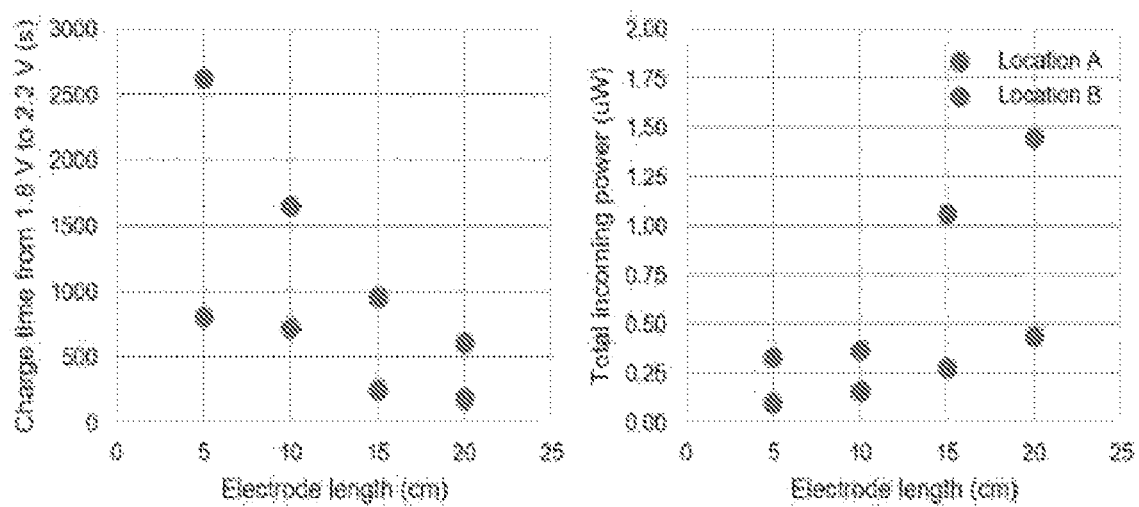
FIG. 6 illustrates a graphical representation of charge time of the energy harvester with respect to incoming power for different lengths of electrode, according to an embodiment of the present invention.

With respect to FIG. 6, the five type of cables with different gauge, shape and lengths are used and an average power harvested by using the cables is measured. The charge time and the amount of power delivered to the energy harvester varies significantly for cables having a similar gauge. The difference arises due to different capacitive coupling offered by the cables due to variable length of outer shielding, inner conductors, and nature of dielectric used for shielding.

Figure 7:
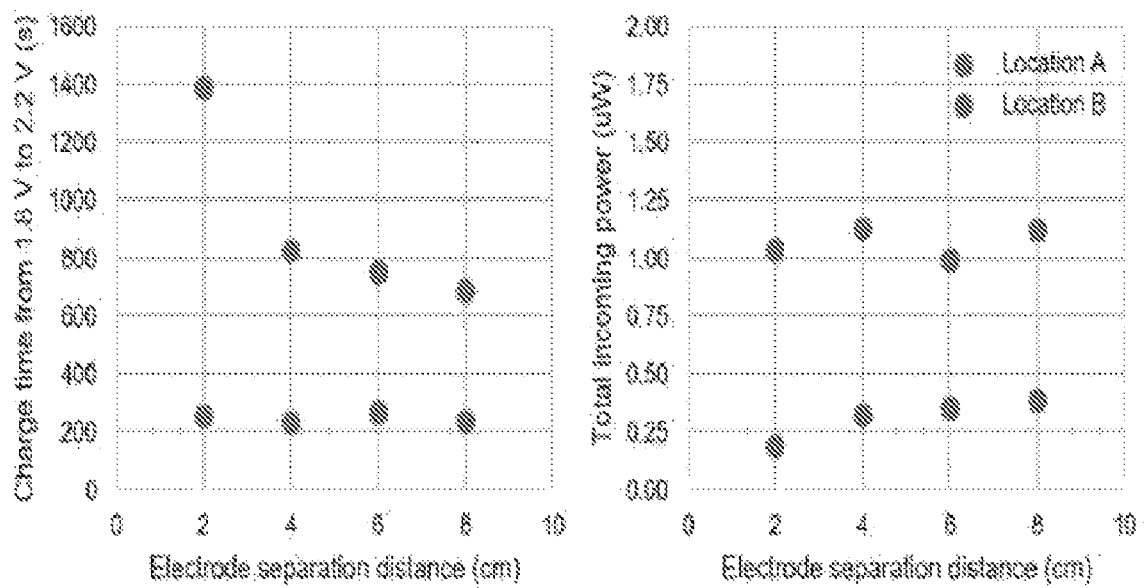
FIG. 7 illustrates a graphical representation of charge time of the energy harvester with respect to incoming power for different separation distances between the two electrodes, according to an embodiment of the present invention.
Figure 8:
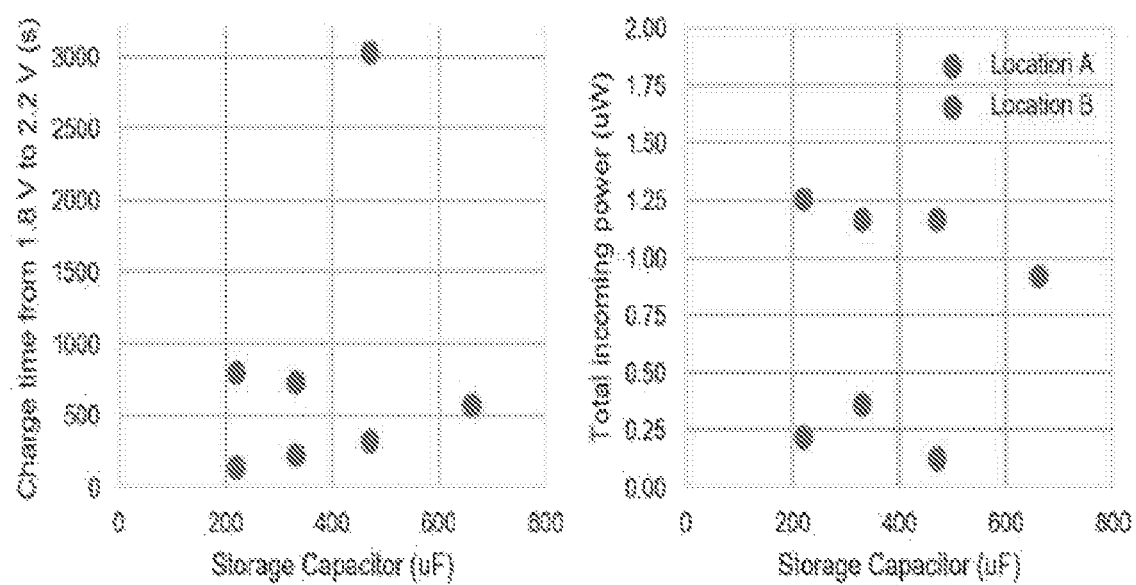
FIG. 8 illustrates a graphical representation of charge time of the energy harvester with respect to incoming power for different capacitors size, according to an embodiment of the present invention.

The design of the electrodes is critical for determining the instantaneous power available at their output. For most applications, a fixed length (14 cm) and spacing (4 cm) of electrodes are used. FIG. 6 and FIG. 7 shows a decrease in the charge time with increased length and separation of electrodes. The location A corresponds to the ground floor of cement office building having tile floor and location B corresponds to the fifth floor of the same building having carpet surface.

The time required to store energy on the storage capacitor depends on the length of electrodes as the instantaneous power varies with the length of the harvesting electrodes. The threshold voltage of the high-side switch also controls the output voltage of the energy harvester. For sparse sensing applications, the discharge time from $V_{init}$ to $V_{final}$ is few milliseconds and the average voltage output is around $(V_{init}+V_{final})/2$.

For most of the applications, a high-side switch having a threshold voltage of 1.8 V and turn on voltage of 2.21 V is used as the said high side switch serves most of the sensing applications. For applications, which require more than a 2 V input, like sensing environmental parameters or powering a time-lapse camera, a high-side switch with a threshold of 3 V and a turn-on voltage of 3.5 V is used. Further, the timer is programmed to the drive output load in a periodic manner for a known duration, thus facilitating continuous sensing by delivering a small amount of energy after a known time interval.

Figure 9:
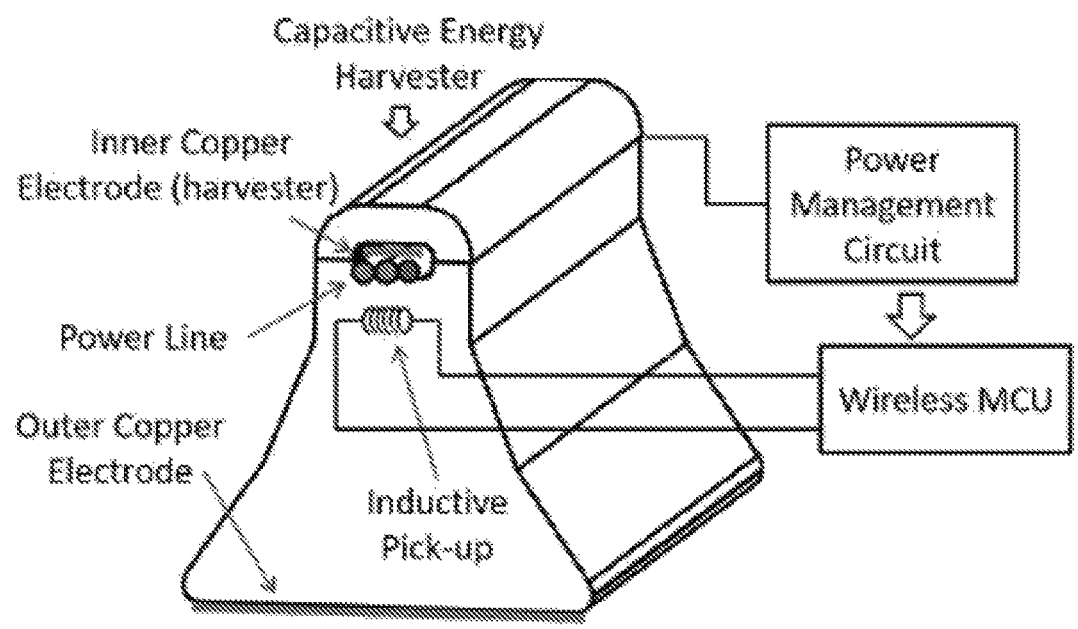
FIG. 9 illustrates a block diagram of the energy harvester with an inductive pick-up for sensing an appliance state (on/off) and capacitive electrodes, according to an embodiment of the present invention.

FIG. 9 illustrates a block diagram of the energy harvester with an inductive pick-up for sensing an appliance state (on/off) and capacitive electrodes, according to an embodiment of the present invention. With respect to FIG. 9, the energy harvester implements a plurality of applications facilitated a stick-one tag for appliance state monitoring. The tag uses an inductive pick-up connected to an ADC to detect appliance state (on/off) using stray magnetic fields present around power cords. Ideally, the net magnetic field present around multi-wire power cables with phase, neutral and earth wires bundled together to be zero. However, depending on the position of the inductive pick-up around a wire bundle and the bundle's asymmetry, stray magnetic fields with low sound to noise ration (SNR) are sensed. The present tag detects stray magnetic field with low SNR for loads of approximately 500 W. Once the storage capacitor reaches the threshold (2.21 V), the wireless MCU turns on, which is programmed to immediately take 56 ADC samples at a sampling rate of 3.360 kHz. The parameters are chosen to ensure capturing of an entire 60 Hz AC cycle. Then, the signal is demeaned and the signal energy is computed. The signal value is transmitted back to a base station over an RF link. A threshold is used to detect the appliance ON/OFF state followed. The said application requires an energy budget of 250 µj, which is facilitated by the use of a 330 µF storage capacitor. In the testing, this resulted in an average duty cycle of 1 transmission every 13 minutes.

Figure 10:
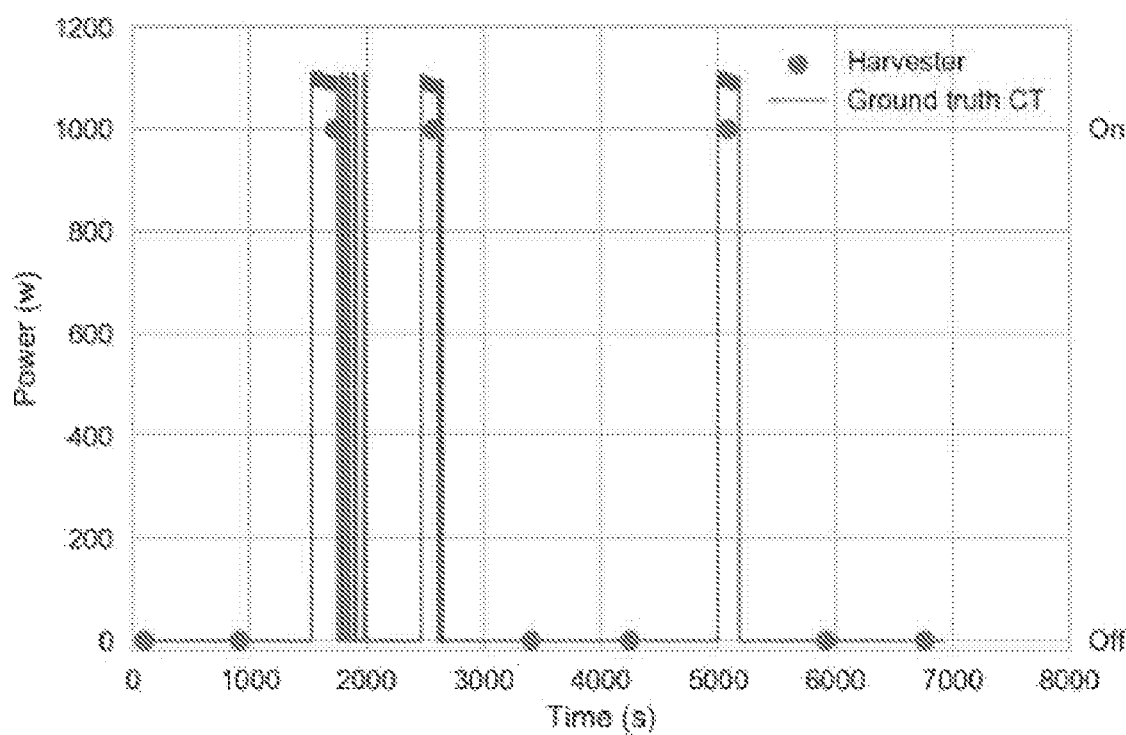
FIG. 10 illustrates a graphical representation an appliance state information (on/off) for a 1 kW hot plate measured with respect to ground truth data, according to an embodiment of the present invention.
Figure 11:
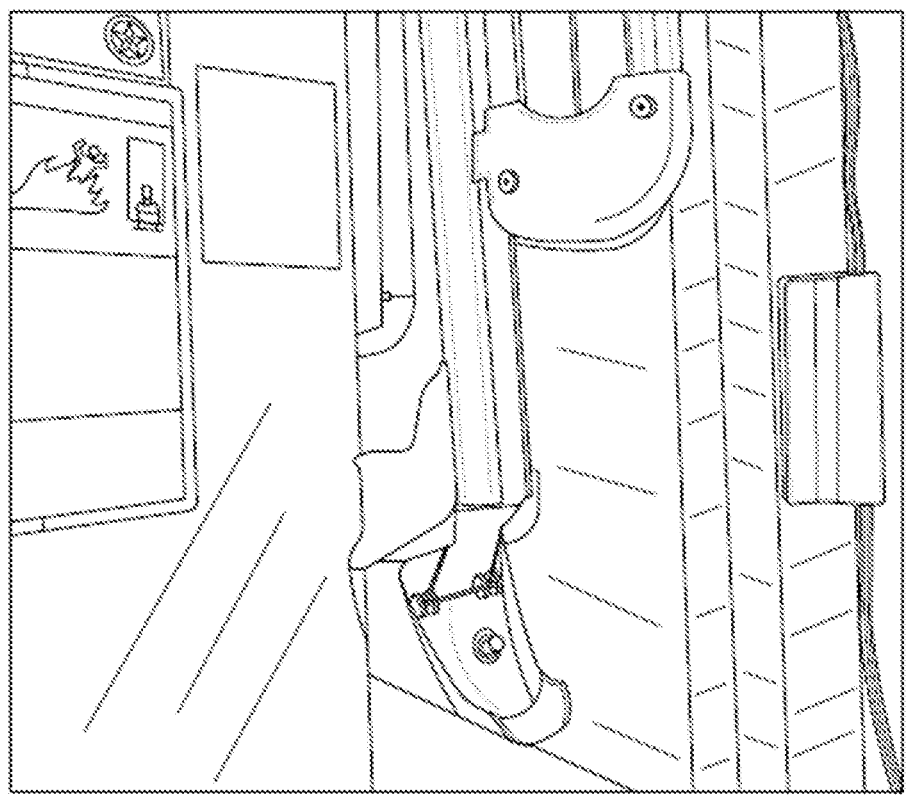
FIG. 11 illustrates an exemplary diagram depicting implementation of a temperature monitor deployed on a stud, according to an embodiment of the present invention.
Figure 12:
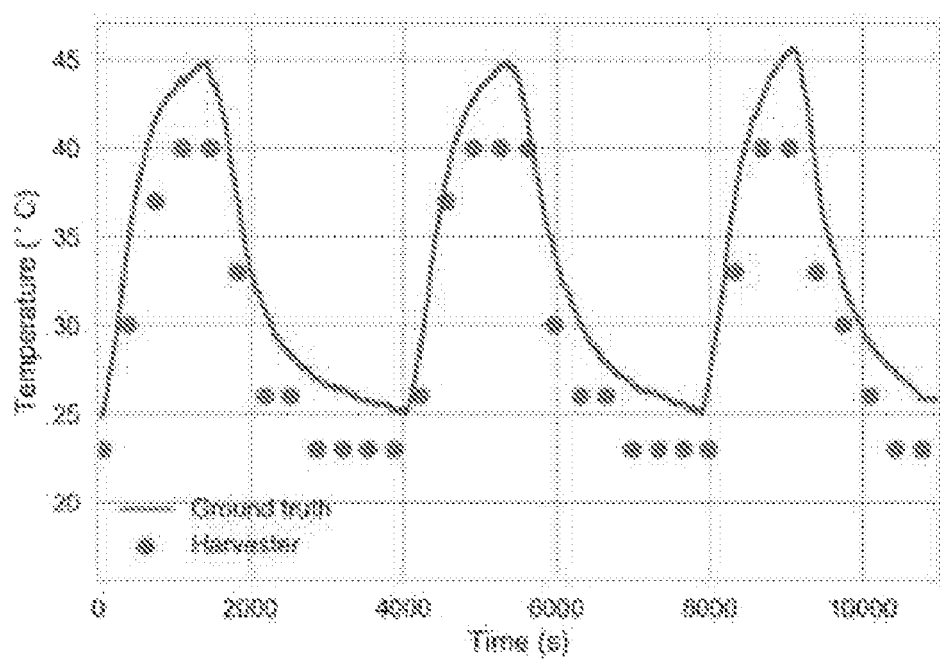
FIG. 12 illustrates a graphical representation of a temperature variation logged using on-chip temperature sensor powered through the energy harvester along with the ground truth data logged using high resolution temperature sensor, according to an embodiment of the present invention.

FIG. 10 illustrates a graphical representation an appliance state information (on/off) for a 1 kW hot plate measured with respect to ground truth data, according to an embodiment of the present invention. FIG. 11 illustrates an exemplary diagram depicting implementation of a temperature monitor deployed on a stud, according to an embodiment of the present invention. The distributed temperature across a building is gathered to create an hourly heat map of the building.

Generally, most building managers perform temperature logging on an hourly basis for fine grained control of heating ventilation and air-conditioning (HVAC) systems. The HVAC, being the most energy-expensive load in any commercial or residential building, requires indoor temperature sensing for an effective scheduling of different zones. This requires putting temperature loggers in each and every zone and as the deployment scales, keeping track of batteries becomes a challenging job. The tracking of batteries is provided by enabling temperature sensing powered by the capacitive energy harvester connected to power lines that are close to air handling units (AHUs). For this application, a 220 uF storage capacitor is chosen which results in an average transmission every 6 min with a standard capacitive electrode (14 cm long with a 4 cm separation between electrodes).

Figure 13:
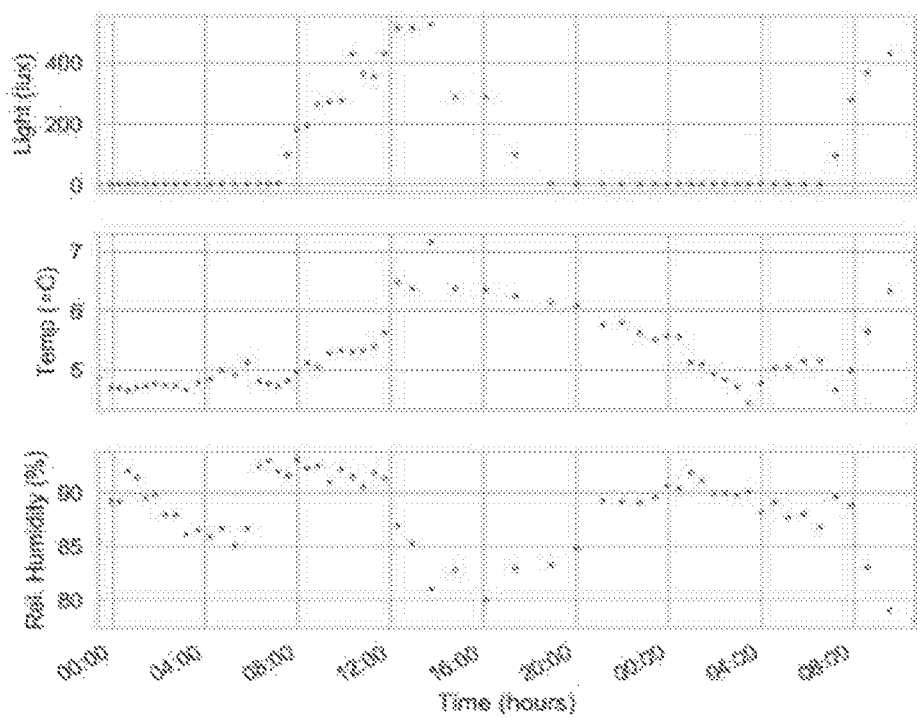
FIG. 13 illustrates a graphical representation of environmental parameters logged by the energy harvester over a period of over 36 hours, according to an embodiment of the present invention.

FIG. 13 illustrates a graphical representation of environmental parameters logged by the energy harvester over a period of over 36 hours, according to an embodiment of the present invention. The farm check demonstrates sensing environmental parameters like temperature, humidity, and light intensity for indoor vertical farming applications. In contrast to previous applications, the farm check requires the most power and a 3 V power supply for operation. These requirements are met by designing a circuit that employs a high-side switch with a threshold voltage (Vth) of 3 V and a '660' µF storage capacitor resulting in being able to produce '1072' µj. On an average, this results in a RF transmission every 27 minutes.

Further, although all above experiment results are with '110' V AC power lines, it can also be used with '220' V AC power lines since the reverse voltage of the diodes in the rectifier bridge is high enough. Also, the junction capacitance of these diodes supports the range of frequencies available in other countries. The design may be used for more HV power lines, by customizing the layout of harvesting electrodes a bit to ensure that voltage output from capacitive harvester along with the available earth ground is enough to sustain the DCL of storage capacitors, i.e. >10-12V. Also, the output of electrodes should be less than the maximum reverse voltage of these diodes. The stray electric field generated on the outer surface of the power line is proportional to the magnitude of the alternating voltage fed through the power line, so the capabilities of this harvester will scale up in regions with AC power lines that have higher voltage ratings.

The harvester advantageously provides a novel battery-free, stick-on capacitive energy harvester that harvests the stray electric field generated around AC power lines without a reference connection to earth ground. The energy harvester also does not require an active load on the power line, making it more widely applicable and easier and safer to deploy. The controlled lab measurements and real-world deployments demonstrate that the device can harvest '270.6' µJ of energy from a '14' cm long interface in '12' minutes. Further, the harvester may be used in a number of possible applications, ranging from sparse sensing of temperature in houses to event-driven appliance state monitoring.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the claims.

What is claimed is:

1. An energy harvester to harvest energy using stray electric-field from low-voltage AC power lines without a physical grounding connection, the energy harvester comprising:

a harvester housing configured to be clamped on to the low-voltage AC power line, the harvester housing comprising an upper portion and a lower portion, wherein the lower portion comprises a support structure with air dielectric;

an inner electrode coupled along an inner periphery of the upper portion of the harvester housing and adapted to wrapped around an outer circumference of the low-voltage AC power line;

an outer electrode coupled to a lower face of the support structure of the lower portion of the harvester housing to provide a local ground reference serving as a lower potential than the inner electrode, wherein the inner electrode and the outer electrode are separated by the air dielectric such that a capacitance (Cs) is formed between the inner and outer electrode to provide an AC voltage output; and a circuit housed within the lower portion of the harvester housing, wherein the circuit comprises:

a diode rectifier bridge connected to the inner electrode and the outer electrode to receive the AC voltage output for AC-DC conversion;

a storage capacitor having a first conducting plate and a second conducting plate, wherein the first conducting plate is connected with the positive output of the diode rectifier bridge and a second conducting plate is connected with the negative output of a diode rectifier bridge, to receive an output of the diode rectifier bridge to harvest energy;

a high side switch connected to the storage capacitor to manage the harvested energy, wherein the high-side switch turns 'ON' an output as the storage capacitor hits a value of $V_{th}$+500 mV and allows a discharging of the storage capacitor to $V_{th}$, wherein $V_{th}$ is a pre-programmed threshold voltage of the high side switch.

2. The energy harvester as claimed in claim 1, wherein the circuit further comprises:

a wireless master control unit (MCU) connected to the high side switch; and an antenna connected directly to the wireless MCU.

3. The energy harvester as claimed in claim 1 further comprising:
a computer readable program for wireless sensing, wherein the computer readable program comprises
at least one of a time-based wireless sensing application,
an event-based wireless sensing application, application, and
a continuous wireless sensing application, and
a sparse wireless sensing application.

4. The energy harvester as claimed in claim 1 further comprising: an inductive pick-up for sensing an on/off state of an appliance.

5. The energy harvester as claimed in claim 1, wherein the harvested energy is up to 270 µJ in at least 12 minutes using the inner and outer electrodes of a length of at least 14 cm deployed at least 10 cm above ground.

6. The energy harvester as claimed in claim 5, wherein harvested energy is scalable by changing a dimension of the inner and outer electrodes and a placement above the ground.

7. The energy harvester as claimed in claim 6, wherein the upper portion of the harvester housing adapted to wrapped a bare as well as an insulated wire bundle having the low-voltage AC power.

8. The energy harvester as claimed in claim 1, wherein the high side switch has an on-state current of 70 nA and off-state quiescent current of 100 pA and works without MOSFET based switches as well.

9. An energy harvester to harvest energy using stray electric field from a low-voltage AC power line without a physical grounding connection, the energy harvester comprising:
a harvester housing configured to be clamped on to the low-voltage AC power line, the harvester housing comprising an upper portion and a lower portion, wherein the lower portion comprises a support structure with air dielectric;
an inner electrode coupled along an inner periphery of the upper portion of the harvester housing such that when the harvester housing from along the upper portion is clamped on to the low-voltage AC power line, the inner electrode is adapted to be wrapped around an outer circumference of the low-voltage AC power line;
an outer electrode coupled to a lower face of the support structure of the lower portion of the harvester housing to provide a local ground reference swerving as a lower potential than the inner electrode, wherein the inner electrode and the outer electrode are separated by the air dielectric such that a capacitance (Cs) is formed between the inner and outer electrodes to provide an AC voltage output, and
a circuit housed within the lower portion of the harvester housing to receive the AC voltage output for AC-DC conversion to harvest energy, and to direct stored energy and control an energy discharge.

10. The energy harvester of claim 9, wherein the circuit comprises a diode rectifier bridge having small signal Schottky diodes for converting the AC voltage output to a DC voltage output, wherein the small Schottky diodes have a forward voltage drop (Vf) of around 100 mV (If=1 µA) at 60 Hz.

11. The energy harvester of claim 10, wherein the circuit further comprises a storage capacitor that is coupled to the diode rectifier bridge to harvest energy from the DC voltage output, wherein the storage capacitor has a DCL of 18.8 µA and ESR in a range from about 0.85Ω to about 0.95Ω.

12. The energy harvester of claim 11, wherein the circuit further comprises a high-side switch that turns 'ON' the output voltage as the storage capacitor hits a value of Vth+500 mV and allows a discharging of the storage capacitor to the Vth, wherein Vth is a pre-programmed threshold voltage of the high side switch.

13. The energy harvester of claim 12, wherein the circuit further comprises an inductive pick-up for sensing an on/off state of an appliance.

14. The energy harvester of claim 9, wherein the lower portion has a height of 4 cm such that the separation between the inner and outer electrode is greater than 4 cm, wherein the lower portion has a length of 14 cm such that the outer electrode has a length that is smaller than or equal to 14 cm.

15. The energy harvester of claim 9 further comprising a computer readable program for wireless sensing, wherein the computer readable program comprises at least one of a time-based wireless sensing application, and event-based wireless sensing application, a continuous wireless sensing application and a sparse wireless sensing application.

* * * * *